United States Patent [19]
Leu

[11] Patent Number: 6,015,984
[45] Date of Patent: Jan. 18, 2000

[54] CAPACITOR WITH OXIDE/NITRIDE/OXIDE COMPOSITE DIELECTRIC SUITABLE FOR EMBEDDED NONVOLATILE MEMORY IN ANALOG APPLICATIONS

[75] Inventor: Len-Yi Leu, Hsinchu, Taiwan

[73] Assignee: Winbond Electronics Corp., Hsinchu, Taiwan

[21] Appl. No.: 09/156,582

[22] Filed: Sep. 18, 1998

[51] Int. Cl.[7] .................. H01L 21/336; H01L 21/8242
[52] U.S. Cl. ................... 257/298; 438/265; 438/241; 438/259; 438/266; 438/270; 438/264; 438/258; 438/263; 257/316; 257/301
[58] Field of Search ..................... 438/265, 241, 438/259, 266, 270, 264, 258, 263; 257/316, 301

[56] References Cited

U.S. PATENT DOCUMENTS

| | | | |
|---|---|---|---|
| 5,532,181 | 7/1996 | Takebuchi et al. | 438/258 |
| 5,556,799 | 9/1996 | Hong | 438/264 |
| 5,780,341 | 7/1998 | Ogura | 438/259 |
| 5,885,871 | 3/1999 | Chan et al. | 438/265 |

*Primary Examiner*—Carl Whitehead, Jr.
*Assistant Examiner*—Matthew E. Warren
*Attorney, Agent, or Firm*—W. Wayne Liauh

[57] ABSTRACT

An improved process for making embedded memory cells is disclosed which is based on a bifurcated two-polysilicon structure. The embedded memory cell contains a memory cell portion and an embedded capacitor portion. The memory cell portion contains a floating gate, a control gate and an oxide/nitride/oxide (ONO) layer sandwiched therebetween, and the embedded capacitor portion similarly contains a top electrode, a bottom electrode, and an oxide/nitride/oxide layer also sandwiched therebetween. The floating gate and the bottom electrode of the embedded capacitor portion are simultaneously made from the same poly1 layer. However, unlike the prior art devices, the poly1 layer is bifurcated via simple photolithographic sequences such that the bottom electrode of the embedded capacitor portion has a high degree of doping than the floating gate. As a result, the bifurcated two-polysilicon structure provides the same level of performance, with regard to both the memory cell portion and the capacitor portin, as the conventional three-polysilicon structure, and no comprise is necessary.

6 Claims, 4 Drawing Sheets

CAPACITOR WITH OXIDE/NITRIDE/OXIDE COMPOSITE DIELECTRIC SUITABLE FOR EMBEDDED NONVOLATILE MEMORY IN ANALOG APPLICATIONS

FIELD OF THE INVENTION

The present invention relates to a method for fabricating integrated circuit capacitor embedded into a dual-polysilicon nonvolatile memory cell, such as EPROM, EEPROM or flash memory, and the memory cells fabricated there from. More specifically, the present invention relates to an improved method for fabricating embedded "dual-polysilicon-type" nonvolatile memory cells for analog applications which include one or more integrally incorporated polysilicon-to-polysilicon, or the so-called "interpoly", capacitors. The embedded memory cell of the present invention contains a flash memory portion and a capacitor portion, and both portions comprise the same oxide/nitride/oxide layer sandwiched by essentially the same polysilicon layers formed from the same photolithographic events. However, in the present invention, the fabrication process is modified so that, unlike the prior art techniques, a high-performance embedded capacitor and a high-performance stacked gate flash memory can be both provided in the same memory cell without having to make any compromise.

BACKGROUND OF THE INVENTION

In order to save processing cost and reduce cell size, it has become a common practice to incorporate ("embed") analog circuits such as capacitors to nonvolatile memory cells such as EPROM, EEPROM, and flash memories. The so-called embedded memory cells can be and have been advantageously used in many applications such as in making telecommunication equipment, especially in the manufacturing of light-weight wireless phones. Another important application is to incorporate DRAM cells, each of which typically contains a single transistor and a single capacitor, into a flash memory.

Conventional embedded flash memory cells typically assume a three-polysilicon structure, with the first and second polysilicon layers, along with an oxide/nitride/oxide (ONO) layer, forming the stacked or split gate portion of the embedded structure, and with the second and third polysilicon layers, along with a capacitor dielectric layer, forming the capacitor portion of the embedded structure. Such a three-polysilicon structure is necessary because of the different levels of doping required of the floating gate and of the bottom electrode. On the one hand, the doping level of both of the two polysilicon electrodes of the capacitor portion should preferably be very high in order to avoid the possible degradation of capacitor voltage coefficient due to the parasitic depletion of capacitance inside the polysilicon films. On the other hand, the floating gate is usually lightly doped to ensure the quality and reliability of the gate oxide beneath the floating gate, and of the interpoly dielectric (e.g., the ONO layer) formed between the floating gate and the control gate.

Because of the requirement of a very highly doped polysilicon electrode for the capacitor, the first polysilicon formed for forming the floating gate cannot be used as the base for forming the bottom electrode of the capacitor. As a result, the bottom capacitor must be, at the best, made from the second polysilicon, and a third polysilicon must be formed to serve as the top capacitor electrode. Thus, an embedded nonvolatile memory device for analog applications will involve a triple-polysilicon structure, and a capacitor interpoly dielectric is sandwiched between the highly doped second and third polysilicons. The second polysilicon serves both as the control gate of the memory cell, as well as the bottom electrode of the integrally embedded capacitor. And the "extra" third polysilicon serves as the top electrode of the capacitor. Such triple-polysilicon structure embedded nonvolatile memory device, inevitably results in substantially increased processing cost as well as process complexity.

U.S. Pat. No. 5,563,762 discloses a capacitor structure for an integrated circuit which comprises a bottom electrode, capacitor dielectric and top electrode formed on a passivation layer overlying the interconnect metallization. The capacitor electrodes are interconnected to the underlying integrated circuit from underneath, through conductive vias, to the underlying interconnect metallization. The passivation layer serves as a barrier layer for a ferroelectric dielectric. Large area on-chip capacitors can be added without affecting the interconnect routing or packing density of the underlying devices.

U.S. Pat. No. 5,359,216 discloses a method for fabricating DRAM cells having an upper capacitor plate over a polysilicon storage gate. The built-in capacitor contains a dielectric which is formed as an oxide-nitride composite then reoxided, so as to provide a very high specific capacitance and very good integrity between the first poly storage gate and the (second or third poly) upper capacitor plate. The structure provides the advantages of high dielectric integrity, high specific capacitance, uniformity and reproducibility.

U.S. Pat. No. 4,818,711 discloses a method for growing a high quality oxide layer on the surface of a polysilicon film for use as an interpoly dielectric. The method comprises the steps of depositing a silicon film on a wafer and implanting the silicon film with phosphorous ions. The wafers are then sent into a diffusion tube to activate the dopant. The operation is carried out in an ambient of dry oxygen so as cause the silicon film to become polysilicon film and an oxide layer formed on the polysilicon film. The wafers are then implanted, through the oxide layer, using argon ions to cause the surface layers of the polysilicon layer to be rendered amorphous. The oxide layer grown on the polysilicon film is then removed, and a new oxide layer is then grown on the polysilicon film which exhibits excellent physical and electrical characteristics.

U.S. Pat. No. 4,882,649 discloses an integrated circuit capacitor with improved leakage and storage characteristics. It contains a dielectric material which consists of a first layer of silicon nitride adjacent the silicon substrate lower plate upon which a layer of silicon dioxide is formed. A second layer of silicon nitride is formed over the silicon dioxide layer, above which the second plate is formed. The layer of silicon dioxide can be formed by partial oxidation of the first silicon nitride layer.

The above patents give examples of some of the research work that has been done in the industry relating to embedded flash memory cells. However, none of the research efforts taught the fabrication of flash memory cells involving a two-polysilicon structure.

U.S. Pat. No. 5,442,210 discloses a semiconductor device which contains a DRAM portion forming a cache memory and a flash memory portion fabricated on a common substrate. A bottom electrode layer common to the capacitors of the DRAM portion and a floating gate layer of the flash memory portion are formed simultaneously from the same first polysilicon layer (poly1), and a top electrode layer common to the capacitors of the DRAM portion, a gate electrode layer for a transistor of the DRAM portion, and a control gate layer of the flash memory portion are formed simultaneously from the same second polysilicon layer (poly2). The technique disclosed in the '210 patent can be utilized to fabricate two-polysilicon structured embedded flash memory. However, because the bottom electrode layer and the floating gate of the embedded structure have the same doping level, the embedded flash memory cell will likely to have either an unsatisfactory capacitor portion or an unsatisfactory memory portion, or both. Indeed, the two-polysilicon structure disclosed in the '210 exemplifies the main reason why the trend in the industry has moved into the three-polysilicon structure for the fabrication of embedded memory cells.

As shown in FIG. 1 of the '210 patent, the capacitor in the DRAM cell is formed with two capacitors in parallel, the lower capacitor is the tunnel oxide dielectric film (16a and 16b) sandwiched by the 1st poly (18a and 18b) and the p+ diffusion region (15), and the upper capacitor is the oxide film (19a, b, c, d) and the oxide/nitride/oxide composite film (21a, b) sandwiched between the 1st poly and the 2nd poly (23a, b). The thin oxide (16a and 16b) serves as the tunnel oxide for the flash memory, and as one of the capacitor dielectric films. The 1st poly serves as the floating gate (FG) of the flash memory cell and as the common electrode for the lower and upper capacitors in the DRAM cell. The thin oxide in 19a, b, c, d is employed as the insulating layer between the poly1 edge sidewall and the poly2 in the capacitor region of the DRAM cell, the CMOS gate oxide of the DRAM cell, and the poly oxidation of the FG in the flash memory cell, respectively. The 2nd poly is doped as p-type to allow good contact with p+ diffusion region 15, it also serves as the top electrode for the upper capacitor and the CMOS poly gate, and as the control gate (CG) of the flash memory cell. The tunnel oxide, which serves as the capacitor dielectric of the lower capacitor, is grown on the p+ diffusion region. Since the tunnel oxide is usually very thin (typically between 60 Å and 120 Å) and has relatively poor quality and thickness control above the heavily doped region, the high leakage current from the lower capacitor (and, in turn, the entire DRAM capacitor) is expected to result in poor data retention. Also, the 2nd poly film overlaps the poly1 edge in the capacitor region, where poly1 sidewall oxide (19) is the only insulating layer between the two poly electrodes. Since the poly1 edge is expected to have the highest electric field whenever there is a voltage drop between the two poly electrodes, the poor quality of the oxide is typically not sufficient to ensure a low leakage capacitor. The situation becomes worsened in nonvolatile memory applications, which typically involve a high voltage drop across the capacitors. Furthermore, the 1 st poly, which serves as the FG for the flash memory, is not heavily doped in order to keep good quality of the tunnel oxide and the oxide/nitride/oxide. As a result, by using poly1 as the common electrode of the lower and the upper capacitors, the voltage coefficient of the capacitor is expected to be high. Additionally, in the '210 patent, poly2 has to be doped with p-type dopants in order to allow good contact with the p+ diffusion region. In other words, the CMOS gate in the '210 is p-type doped, and, as a result, the threshold voltage of the NMOS device is expected to be very large.

SUMMARY OF THE INVENTION

The primary object of the present invention is to develop an improved method for fabricating two-polysilicon-structured embedded nonvolatile memory cells for analog applications which include integrally incorporated polysilicon-to-polysilicon capacitors. More specifically, the primary object of the present invention is to develop an improved method for fabricating embedded flash memory cells which contain a capacitor portion and a flash memory portion fabricated on a common substrate, wherein the bottom electrode layer of the capacitor portion and the floating gate layer of the flash memory portion are formed simultaneously from the same first polysilicon layer (poly1) but are allowed to have different doping levels. The bifurcated two-polysilicon structure of the present invention allows the embedded flash memory cell to provide high performance in both the capacitor portion the memory cell portion, while substantially reducing the fabrication cost associated with three-polysilicon-structure embedded flash memory cells. Also, by sharing the oxide/nitride/oxide inter-poly dielectric of the memory cell with the capacitor dielectric, the capacitance valve per unit area can be significantly enhanced.

The method disclosed in the present invention comprises the following main steps:

(1) Forming a tunnel oxide layer on a substrate having a field oxide layer;

(2) Forming a first polysilicon (poly1) layer on the substrate covering the tunnel oxide layer, followed by poly1 doping or implantation; the poly1 layer will be eventually formed into the floating gate electrode and the bottom electrode of the embedded capacitor;

(3) Forming a first poly1 photoresist on the poly1 layer, the first poly1 photoresist is patterned to form a floating gate in a memory region of the poly1 layer and a bottom electrode in a capacitor region of the poly1 layer;

(4) Using the first poly1 photoresist to perform a first poly1 etch to form the floating gate and the bottom electrode;

(5) Forming a second poly1 photoresist on the poly1 layer, the second poly1 photoresist is patterned to reveal only the bottom electrode;

(6) Using the second poly1 photoresist to perform addition implantation in the bottom electrode;

(7) Forming an Oxide/Nitride/Oxide (ONO) layer on the substrate;

(8) Forming a second polysilicon (poly2) layer on the substrate covering the ONO layer, followed by poly2 doping or implantation; the poly2 layer will be eventually formed into the control gate electrode and the top electrode of the embedded capacitor;

(9) Forming a first poly2 photoresist on the poly2 layer, the first poly2 photoresist is patterned to define a control gate in a memory region of the poly2 layer while covering at least the capacitor region of the poly2 layer;

(10) Using the first poly2 photoresist to perform a first poly2 etch, for example, a stacked gate self-aligned etch (SAE) to form the control gate;

(11) Forming a second poly2 photoresist on the poly2 layer, the second poly1 photoresist is patterned to reveal only the top electrode;

(12) Using the second poly2 photoresist to perform a second poly2 etch and form the top electrode;

(13) Using the second poly2 photoresist to perform an ONO etch;

(14) Removing the poly2 photoresist and cleaning.

With the process described above, the embedded flash memory cell of the present invention will have a lightly doped floating gate and a heavily doped bottom electrode, both were formed simultaneously from the same poly1 layer. The present invention thus allows a flash memory cell to be formed based on two-polysilicon structure but exhibits the same level of performance as a three-polysilicon structure. The two-polysilicon structure of the present invention also allows the fabrication cost to be substantially reduced.

BRIEF DESCRIPTION OF THE DRAWING

The present invention will be described in detail with reference to the drawing showing the preferred embodiment of the present invention, wherein:

FIG. 7 shows that an Oxide/Nitride/Oxide (ONO) layer is formed on the substrate, after the removal of the poly1 photoresist, covering both the floating gate and the bottom electrode, and the space in between;

DETAILED DESCRIPTION OF THE PREFERRED EMBODIMENT

Figure 1:
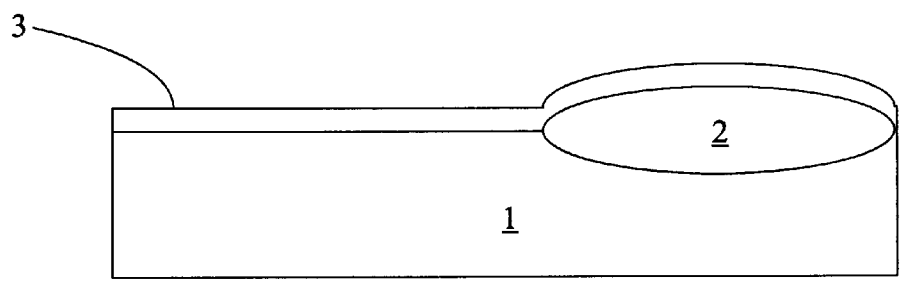
FIG. 1 is a schematic diagram showing that a tunnel oxide layer is formed on a substrate having a field oxide layer.

The present invention discloses an improved method for fabricating two-polysilicon-structured embedded nonvolatile memory cells for analog applications which include integrally incorporated polysilicon-to-polysilicon capacitors. The embedded flash memory cell made from the process disclosed in the present invention contains a capacitor portion and a flash memory portion fabricated on a common substrate, wherein the bottom electrode layer of the capacitor portion and the floating gate layer of the flash memory portion are formed simultaneously from the same first polysilicon layer (poly1) but are further photolithographically processed to have different doping levels, so as to allow the floating gate to have a low doping level and the bottom electrode a high doping. Such a bifurcated poly1 structure of the embedded flash memory cell of the present invention allows high performance to be obtained in both the capacitor portion the memory cell portion.

With the process disclosed in the present invention, the embedded flash memory cell will have a lightly doped floating gate and a heavily doped bottom electrode, both were formed simultaneously from the same poly1 layer. The present invention thus allows a flash memory cell to be formed based on two-polysilicon structure but exhibits the same level of performance as a three-polysilicon structure. The two-polysilicon structure of the present invention also allows the fabrication cost to be substantially reduced.

The method disclosed in the present invention comprises the following main steps:

(1) Forming a tunnel oxide layer on a substrate having a field oxide layer;

(2) Forming a first polysilicon (poly1) layer on the substrate covering the tunnel oxide layer;

(3) Forming a first poly1 photoresist on the poly1 layer, wherein the first poly1 photoresist is patterned to form a floating gate in a memory region of the poly1 layer and a bottom electrode in a capacitor region of the poly1 layer;

(4) Using the first poly1 photoresist to perform a first poly1 etch so as to form the floating gate and the bottom electrode;

(5) Forming a second poly1 photoresist on the poly1 layer, wherein the second poly1 photoresist is patterned to reveal only the bottom electrode;

(6) Using the second poly1 photoresist to perform addition implantation in the bottom electrode;

(7) Forming an Oxide/Nitride/Oxide (ONO) layer on the substrate;

(8) Forming a second polysilicon (poly2) layer on the substrate covering the ONO layer, followed by poly2 doping or implantation;

(9) Forming a first poly2 photoresist on the poly2 layer, wherein the first poly2 photoresist is patterned to define a control gate in a memory region of the poly2 layer while covering at least the capacitor region of the poly2 layer;

(10) Using the first poly2 photoresist to perform a first poly2 etch to form the control gate;

(11) Forming a second poly2 photoresist on the poly2 layer, wherein the second poly1 photoresist is patterned to reveal only the top electrode;

(12) Using the second poly2 photoresist to perform a second poly2 etch and form the top electrode;

(13) Using the second poly2 photoresist to perform an ONO etch;

(14) Removing the poly2 photoresist and cleaning.

The present invention will now be described more specifically with reference to the following examples. It is to be noted that the following descriptions of examples, including the preferred embodiment of this invention, are presented herein for purposes of illustration and description, and are not intended to be exhaustive or to limit the invention to the precise form disclosed.

EXAMPLE 1

FIGS. 1–12 are illustrative diagrams showing the main steps of a preferred embodiment of the present invention. These figures are discussed in more detail below.

FIG. 1 shows that a tunnel oxide layer 3 was formed on a substrate 1 having a field oxide layer 2 in appropriate dispositions thereof.

Figure 2:
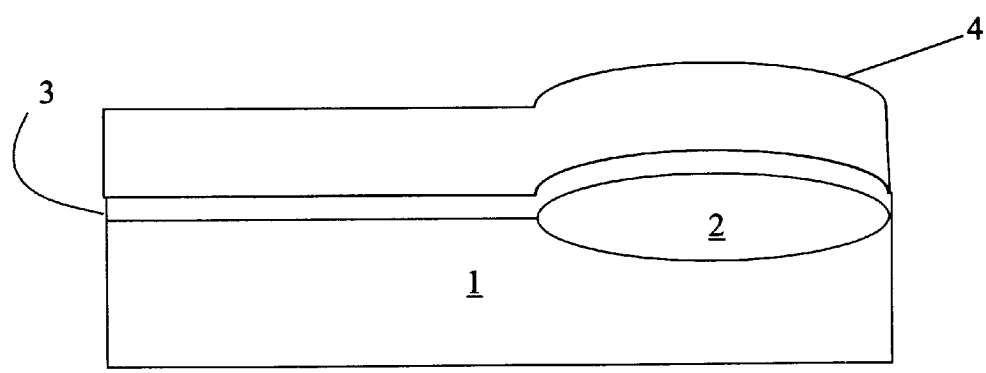
FIG. 2 shows that a first polysilicon (poly1) layer is formed on the substrate covering the tunnel oxide layer, followed by poly1 doping or implantation; the poly1 layer will be eventually formed into the floating gate electrode and the bottom electrode of the embedded capacitor.

FIG. 2 shows that a first polysilicon (poly1) layer 4 was formed on a substrate covering the tunnel oxide layer 3, followed by poly1 doping or implantation. As discussed below, the poly1 layer will be eventually formed into the floating gate electrode and the bottom electrode of the embedded capacitor.

Figure 3:
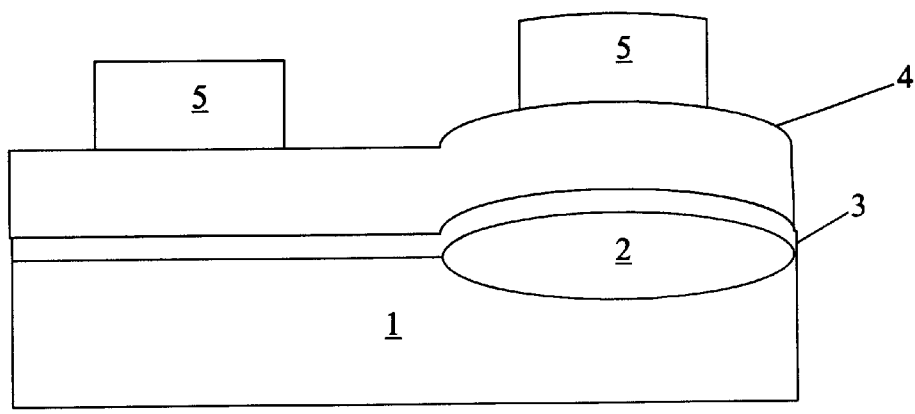
FIG. 3 shows that a first poly1 photoresist is formed on the poly1 layer which is patterned to form a floating gate in a memory region of the poly1 layer and a bottom electrode in a capacitor region of the poly1 layer.

FIG. 3 shows that a first poly1 photoresist 5 was formed on the poly1 layer 4 which was patterned so to the subsequent formation of a floating gate in a memory region of the poly1 layer and a bottom electrode in a capacitor region of the poly1 layer.

Figure 4:
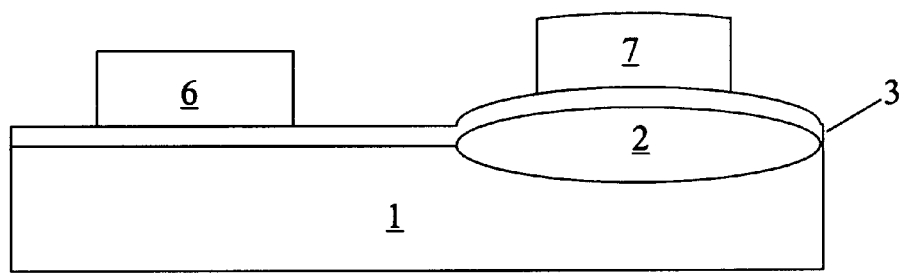
FIG. 4 shows that the floating gate and the bottom electrode are formed using a first poly1 etch process using the poly1 photoresist.

FIG. 4 shows that the floating gate 6 and the bottom electrode 7 were formed using a first poly1 etch process using the poly1 photoresist 5.

Figure 5:
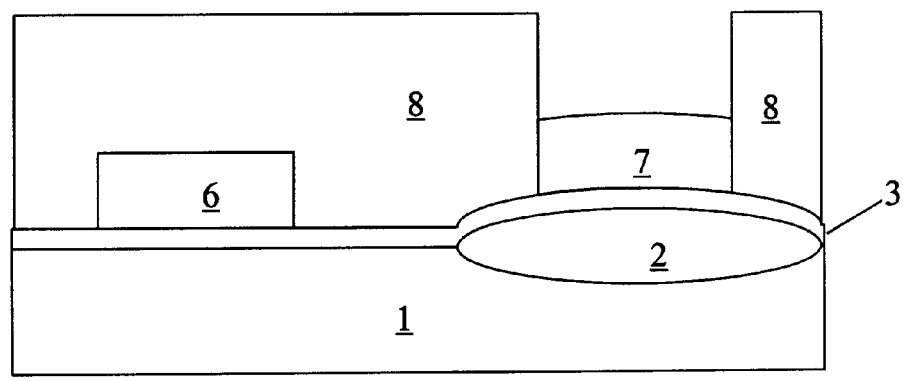
FIG. 5 shows that a second poly1 photoresist is formed on the poly1 layer, the second poly1 photoresist is patterned to reveal only the bottom electrode.

FIG. 5 shows that a second poly1 photoresist 8 was formed on the poly1 layer which was patterned to reveal only the bottom electrode 7.

Figure 6:
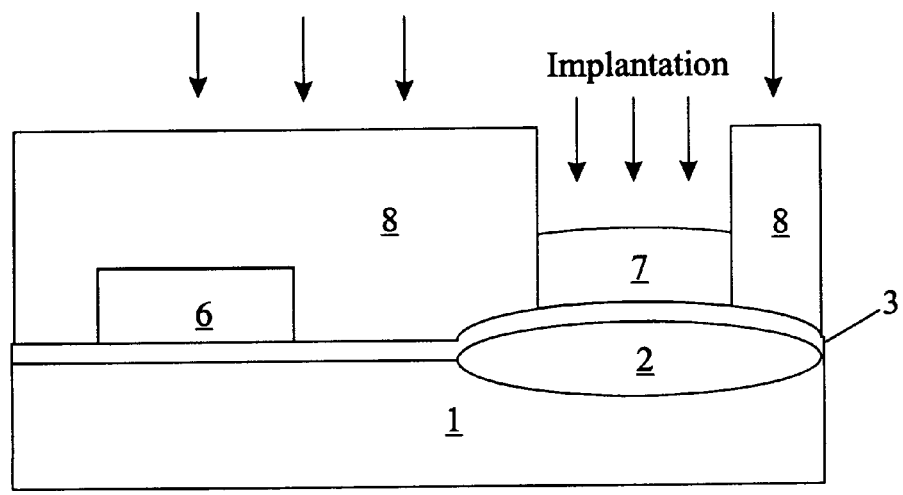
FIG. 6 shows that additional implantation is performed on the bottom electrode utilizing the second poly1 photoresist.

FIG. 6 shows that additional implantation, for example, Arsenic doping, was performed on the bottom electrode utilizing the second poly1 photoresist.

Figure 7:
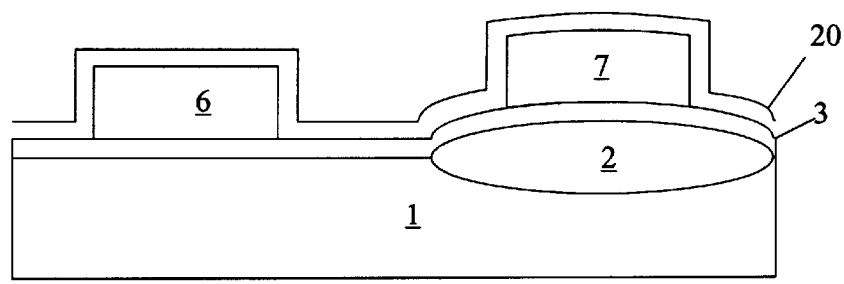

FIG. 7 shows that an Oxide/Nitride/Oxide (ONO) layer 20 was formed on the substrate covering both the floating gate 6 and the bottom electrode 7, as well as the space in between and beyond, after the removal of the poly1 photoresist 8. Preferably the ONO layer has a thickness of about 100 to 1,000 Å.

Figure 8:
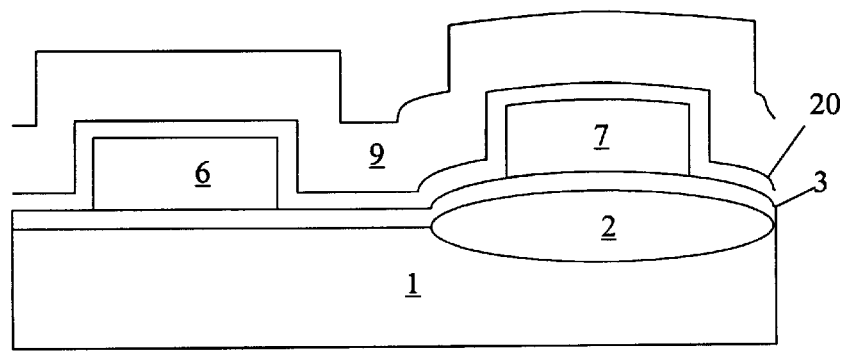
FIG. 8 shows that a second polysilicon (poly2) layer is formed on the substrate covering the ONO layer, followed by poly2 doping or implantation; the poly2 layer will be eventually formed into the control gate electrode and the top electrode of the embedded capacitor.
Figure 9:
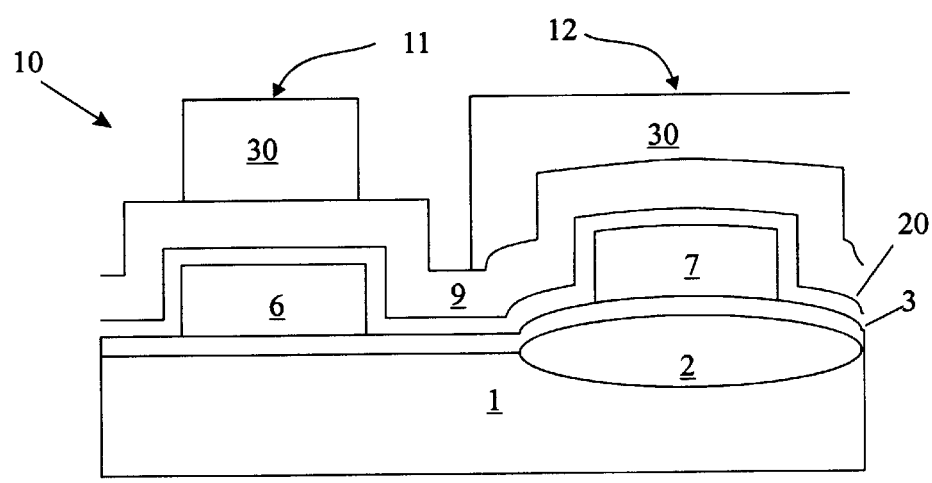
FIG. 9 shows that a first poly2 photoresist is formed on the poly2 layer, the first poly2 photoresist is patterned to define a control gate in a memory region of the poly2 layer while covering at least the capacitor region of the poly2 layer.

FIG. 8 shows that a second polysilicon (poly2) layer 9 was formed on the substrate covering the ONO layer, followed by poly2 doping or implantation. As discussed below the poly2 layer 9 will be eventually formed into the control gate electrode and the top electrode of the embedded capacitor;

FIG. 9 shows that a first poly2 photoresist 30 was formed on the poly2 layer 9 which was patterned to define a control gate in a memory region 11 of the flash memory cell 10 while covering at least the capacitor region 12.

Figure 10:
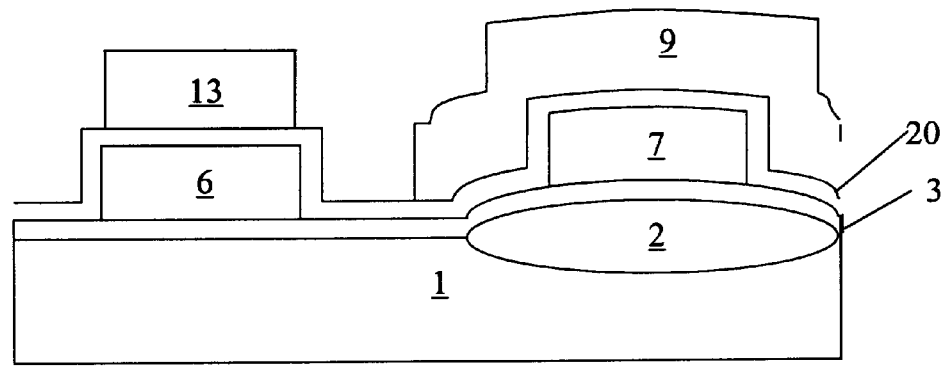
FIG. 10 shows that a first poly2 etch is performed to form the control gate using the first poly2 photoresist.

FIG. 10 shows that a first poly2 etch was performed to form the control gate 13 using the first poly2 photoresist 30.

Figure 11:
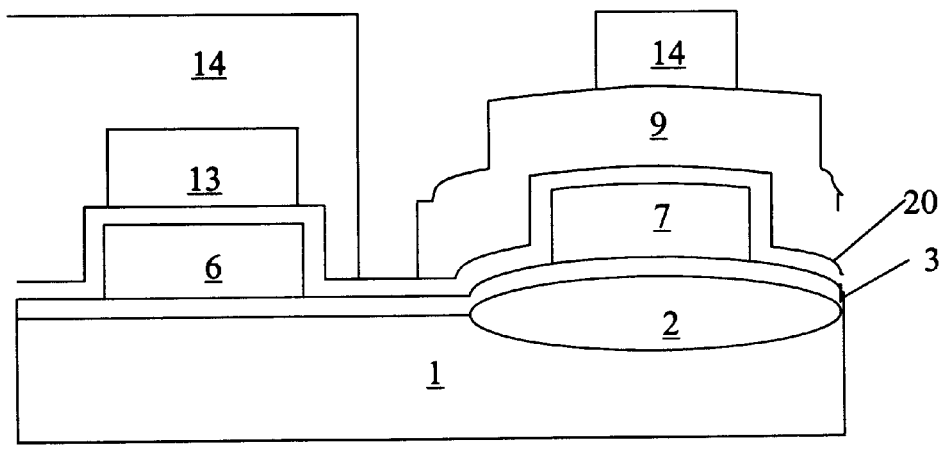
FIG. 11 shows that a second poly2 photoresist is formed on the poly2 layer, the second poly1 photoresist is patterned to reveal only the top electrode.

FIG. 11 shows that a second poly2 photoresist 14 was formed on the flash memory cell 10 which was patterned to reveal only the top electrode.

Figure 12:
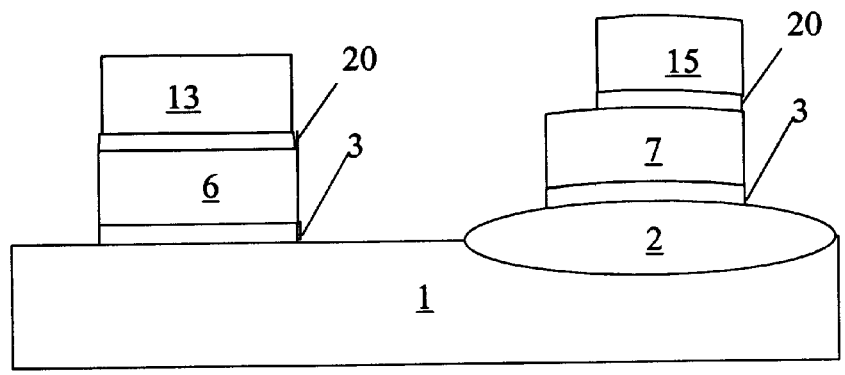
FIG. 12 shows that the top electrode is formed by a second poly2 etch using the second poly2 photoresist, followed by ONO etch.

FIG. 12 shows that the top electrode 15 was formed by a second poly2 etch using the second poly2 photoresist 14, followed by ONO etch and the removal of the second poly2 photoresist 14.

As discussed above, unlike any of the prior art processes, the process disclosed in the present invention allows the embedded flash memory cell to have a lightly doped floating gate in the memory cell portion and a heavily doped bottom electrode in the capacitor portion, while both are formed simultaneously from the same poly1 layer (thus the "bifurcated" two-polysilicon structure). The two-polysilicon-structured embedded flash memory but exhibits the same level of performance as a three-polysilicon structure but at a substantially reduced fabrication cost.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A process for making embedded memory cells comprising the steps of:
   (a) forming a tunnel oxide layer on a substrate having a field oxide layer;
   (b) forming a first polysilicon (poly1) layer on said substrate covering said tunnel oxide layer;
   (c) forming a first poly1 photoresist on said poly1 layer, wherein said first poly1 photoresist is patterned to form a floating gate in a memory region of said poly1 layer and a bottom electrode in a capacitor region of said poly1 layer;
   (d) performing a first poly1 etch using said first poly1 photoresist so as to form said floating gate and said bottom electrode;
   (e) forming a second poly1 photoresist on said poly1 layer, wherein said second poly1 photoresist is patterned to reveal only said bottom electrode;
   (f) using said second poly1 photoresist to perform addition implantation in said bottom electrode;
   (g) forming an Oxide/Nitride/Oxide (ONO) layer on said substrate;
   (h) forming a second polysilicon (poly2) layer on said substrate covering said ONO layer;
   (i) forming a first poly2 photoresist on said poly2 layer, wherein said first poly2 photoresist is patterned to define a control gate in a memory region of said poly2 layer while covering at least said capacitor region of said poly2 layer;
   (j) using said first poly2 photoresist to perform a first poly2 etch to form said control gate, and removing said first poly2 photoresist;
   (k) forming a second poly2 photoresist on said poly2 layer, wherein said second poly1 photoresist is patterned to reveal only said top electrode;
   (l) using said second poly2 photoresist to perform a second poly2 etch and form said top electrode;
   (m) using said second poly2 photoresist to perform an ONO etch;
   (n) removing said poly2 photoresist and cleaning.

2. The process for making embedded memory cells according to claim 1 wherein the step of forming said first polysilicon (poly1) layer on said substrate includes the step of poly1 doping or implantation.

3. The process for making embedded memory cells according to claim 1 wherein said ONO layer has a thickness of about 100 to 1,000 Å.

4. The process for making embedded memory cells according to claim 1 wherein the step of forming said second polysilicon (poly2) layer on said capacitor dielectric includes the step of poly3 doping or implantation.

5. The process for making embedded memory cells according to claim 1 wherein said second poly2 photoresist is patterned to cover an appropriate portion of said poly2 layer so as allow a portion of said bottom electrode to be uncovered by the top electrode which can serve as a contact for said bottom electrode.

6. The process for making embedded memory cells according to claim 1 wherein said first poly2 etch is a stacked gate self-aligned etch (SAE) to form the control gate.

* * * * *